United States Patent [19]

Misawa et al.

[11] Patent Number: 4,484,214
[45] Date of Patent: Nov. 20, 1984

[54] PN JUNCTION DEVICE WITH GLASS MOATS AND A CHANNEL STOPPER REGION OF GREATER DEPTH THAN THE BASE PN JUNCTION DEPTH

[75] Inventors: Yutaka Misawa, Katsuta; Masaaki Takahashi; Hiroaki Hachino, both of Hitachi, all of Japan

[73] Assignee: Hitachi, Ltd., Tokyo, Japan

[21] Appl. No.: 332,713

[22] Filed: Dec. 21, 1981

[30] Foreign Application Priority Data

Oct. 27, 1980 [JP] Japan .................. 55-149453

[51] Int. Cl.³ .............. H01L 29/34; H01L 27/04; H01L 29/74; H01L 29/06
[52] U.S. Cl. .................. 357/52; 357/38; 357/50; 357/48; 357/55; 357/73
[58] Field of Search .............. 357/38, 50, 73, 38 P, 357/48, 52, 55

[56] References Cited

U.S. PATENT DOCUMENTS

| | | | |
|---|---|---|---|
| 3,338,758 | 8/1967 | Tremere | 357/52 |
| 3,755,001 | 8/1973 | Kooi et al. | 357/52 |
| 3,886,582 | 5/1975 | Kobayashi et al. | 357/52 |
| 3,992,232 | 11/1976 | Kaji et al. | 357/52 |
| 4,009,059 | 2/1977 | Nakata | 357/38 |
| 4,105,810 | 8/1978 | Yamazaki et al. | 357/73 |
| 4,148,053 | 4/1979 | Bosselaar et al. | 357/50 |
| 4,298,881 | 11/1981 | Sakurada et al. | 357/38 |

FOREIGN PATENT DOCUMENTS 2851479 5/1979 Fed. Rep. of Germany .
55-123174 9/1980 Japan .

Primary Examiner—Martin H. Edlow
Assistant Examiner—Jerome Jackson, Jr.
Attorney, Agent, or Firm—Antonelli, Terry & Wands

[57] ABSTRACT

A semiconductor device is provided having a semiconductor substrate which has an annular moat formed in one major surface thereof and includes a pn junction terminating at an inner inclined side surface of the moat. In order to provide a high blocking voltage of the pn junction, the moat is filled or coated with glass material having a surface charge capable of inducing, in a semiconductor layer of one conductivity type in contact with the bottom of the moat, carriers having a polarity opposite to the above-mentioned conductivity type. An annular, highly-doped channel stopper region of the above-mentioned conductivity type is provided at the outside of the moat in a manner to be kept in contact with the moat, and the depth of the channel stopper region from the major surface is preferably made greater than the depth of the pn junction from the major surface.

26 Claims, 12 Drawing Figures

FIG. IA
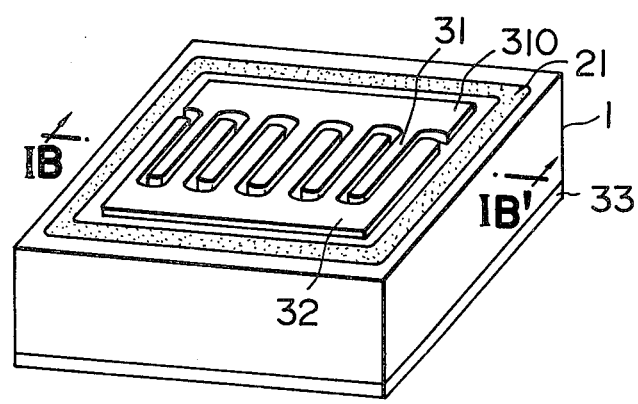
FIG. IB
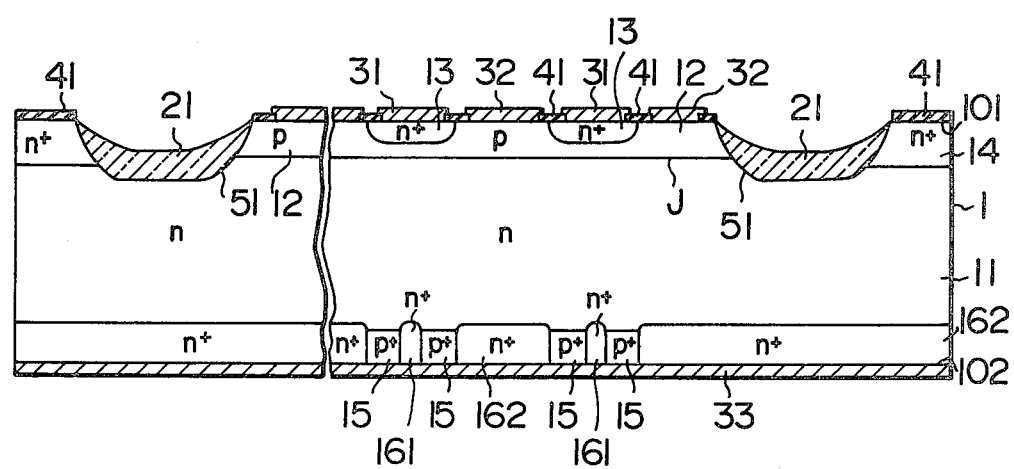

PN JUNCTION DEVICE WITH GLASS MOATS AND A CHANNEL STOPPER REGION OF GREATER DEPTH THAN THE BASE PN JUNCTION DEPTH

The present invention relates to a semiconductor device in which an exposed surface of a semiconductor substrate, to which at least one pn junction is exposed, is passivated with glass material, and more particularly to a semiconductor device in which at least one pn junction is exposed to a groove or moat provided in a semiconductor substrate, and the surface of the groove or moat including the exposed end of the pn junction is passivated with glass material.

In semiconductor devices for rectifying or controlling a current flow such as a diode, a transistor and a thyristor, a surface part of a semiconductor substrate, to which a pn junction formed in the semiconductor substrate is exposed, is protected with an insulating material, namely, a dielectric material. Otherwise, a harmful substance from the outside of the semiconductor device, for example, ions of an alkali metal, water (moisture), or dust, exerts an undesirable influence upon the above surface part, to deteriorate electric characteristics of the semiconductor device (for example, reverse blocking characteristics and leakage characteristics).

Oxide or nitride of silicon, oxide of a metal, resin, and others have hitherto been used as the above-mentioned insulating material.

In recent years, attention has been attracted to preparing glass in the powder state and firing it on a semiconductor substrate for the same purpose as mentioned above. Glass can form a thick film as compared with conventional insulating inorganic materials, is not readily subjected to the influence from the outside, and can form a dense film. Further, a glass film has a high permeation-preventing effect for gas and liquid, as compared with an organic material film.

Glass materials suitable for use in passivation for semiconductor devices include, for example, zinc borosilicate glass which contains ZnO as one of main components, lead borosilicate glass and lead aluminosilicate glass both of which contain PbO and $SiO_2$ as two of main components.

A semiconductor device using glass as passivation material is preferably provided with a groove or moat in one major surface of a semiconductor substrate, and a terminal end of a pn junction to be passivated with glass is exposed to the surface of the groove or moat. Glass is applied in the groove or moat and is then fired to passivate the exposed end of the pn junction with glass. Such a structure advantageously enhances the blocking voltage of the device, and moreover makes it easy to fabricate the semiconductor device. A semiconductor device having such a structure is hereinafter referred to as a moat type semiconductor device.

A preferred example of moat type semiconductor devices using glass as the passivation material is disclosed in Laid-open Specification No. 54-14677 (1979) of Japanese patent application. In this example, a semiconductor region (namely, a channel stopper region) which has the same conductivity type as and is higher in impurity concentration than a semiconductor substrate, is provided at the outer periphery of a moat in order to obtain a high blocking voltage characteristic and high reliability. According to this structure, even when the characteristic of an interface between glass and the semiconductor substrate varies, an adverse effect due to such a variation can be prevented by the channel stopper region, and therefore the high blocking voltage characteristic and high reliability is obtained. However, the above-mentioned laid-open specification is silent as to characteristic of glass used for passivation.

However, detailed experiments made by the present inventors have revealed that even the moat type semiconductor device provided with the channel stopper region may not provide a sufficiently high blocking voltage. As electronic apparatuses are formed of solid state circuits in recent years, a semiconductor device having a blocking voltage of about 1200 V or more is desired so as to control or rectify a current under a high applied voltage in the electronic apparatuses. For example, a horizontal deflection circuit incorporated in a television receiver set requires a transistor having a blocking voltage higher than 1500 V, and a converter for 220 V line requires a gate turn off thyristor having a blocking voltage of at least 1200 V. It is difficult to reproducibly obtain a high blocking voltage of 1200 V or more by conventional moat type semiconductor devices.

An object of the present invention is to provide a moat type semiconductor device having a high blocking voltage characteristic.

Another object of the present invention is to provide a moat type semiconductor device in which a high blocking voltage characteristic is obtained at a higher yield.

In order to attain these objects, according to the present invention, a semiconductor substrate has at least one major surface in which a groove or moat is cut in the form of a closed-loop or ring, and at least one of pn junctions which are formed in the semiconductor substrate and sustains greater part of the voltage applied across the substrate, terminates at the inclined inner side surface of the groove or moat. Further, field mitigating means including a channel stopper region, which is higher in impurity concentration than the bulk of the semiconductor substrate, is provided at the outer periphery of the groove or moat. Furthermore, glass for passivating the terminal edge of the above-mentioned pn junction is sintered in the groove or moat. This glass has a surface charge of such a polarity as to further extend a depletion layer which extends from the pn junction along the groove or moat. That is, when that part of the semiconductor substrate which is contiguous to the bottom of the groove or moat, is an n-type region, the glass has negative charge at the surface thereof to induce positive charge in the part of the substrate contiguous to the groove or moat. The glass is preferably prepared to have a negative surface charge density within a range from $-3 \times 10^{11} cm^{-2}$ to $-9 \times 10^{11} cm^{-2}$, where the minus sign indicates the negative polarity of the surface charge.

Experiments made by the present inventors have revealed that, in moat type semiconductor devices each provided with a highly-doped channel stopper region, the blocking voltage of the above-mentioned pn junction depends upon the angle between a slope of the inner side surface of the moat and a pn junction plane terminating at the slope subtended by a more heavily doped one of the pn-junction-forming regions, and upon a surface charge density of glass which fills the moat. In more detail, when the slope of the moat makes an acute angle with the pn junction plane in the more heavily doped one of the semiconductor regions for forming the pn junction (as conventionally referred to that the slope and the pn junction plane form a negative bevel), the blocking voltage of the pn junction can be improved by coating the moat with glass having negative surface charge in the case where an n-type semiconductor region is contiguous to the moat.

A further investigation made by the present inventors has revealed the facts that when glass having positive surface charge is provided in the moat of a semiconductor device having the above-mentioned negative bevel structure, the pn junction becomes easier to break down in the bulk of the semiconductor substrate. It was also found that the field strength in the channel stopper region provided at the outer periphery of the moat is increased to cause easier breakdown when a negative surface charge, even though negative, exceeds $9 \times 10^{11}/cm^2$, and that the negative surface charge is most preferably in a range from $3 \times 10^{11}/cm^2$ to $9 \times 10^{11}/cm^2$ for preventing easy breakdown of a pn junction and for reproducibly providing a high blocking voltage of the pn junction.

It was also found that the characteristics of the glass-semiconductor interface is also influenced to some extent by the orientation of the semiconductor surface and that the blocking voltage is little influenced by the thickness of the glass layer in a case where the thickness is not less than about 15 μm.

FIG. 1A is a perspective view showing the whole of a thyristor chip of gate turn off type according to an embodiment of the present invention.

FIG. 1B is an enlarged, sectional view taken along the line IB—IB' in FIG. 1A.

FIGS. 6A and 6B are three-component composition diagrams for showing relations between the composition of glass containing ZnO, $B_2O_3$ and $SiO_2$ and the surface charge density $N_{FB}$, wherein FIG. 6A shows the case where the firing temperature of glass is 630° C., and FIG. 6B shows the case where the firing temperature is 780° C.

FIGS. 7A and 7B are three-component composition diagrams for showing relations between the composition of glass containing ZnO, $B_2O_3$ and $SiO_2$ and the coefficient of thermal expansion of the above glass, wherein FIG. 7A shows the case where the firing temperature of glass is 630° C., and FIG. 7B shows the case where the firing temperature is 780° C.

Figure 2:
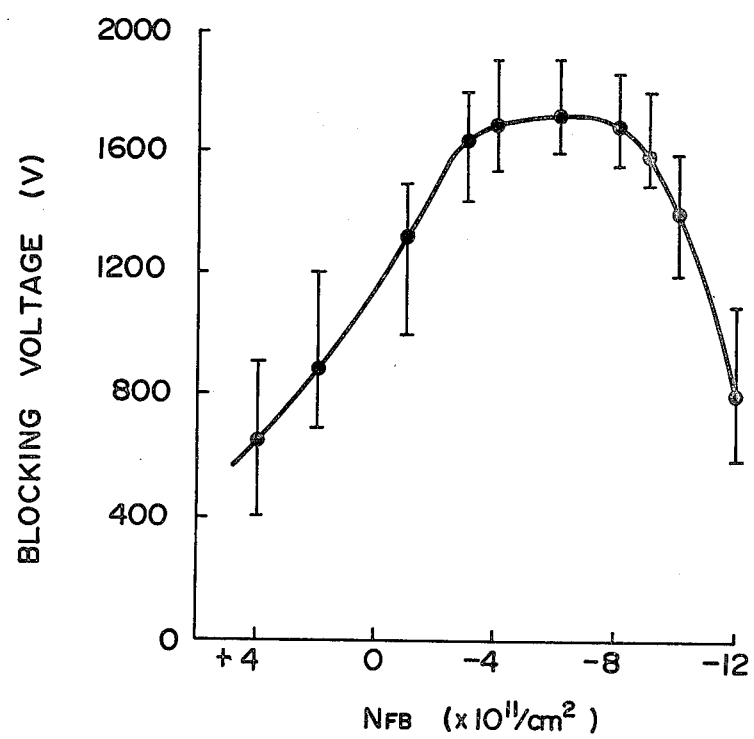
FIG. 2 is a graph showing a relation between the surface charge density $N_{FB}$ of the glass applied to the moat and the forward blocking voltage applied between the anode and cathode in the thyristor of FIG. 1.

FIGS. 1A and 1B show a gate turn off thyristor (hereinafter referred to as a "GTO") according to an embodiment of the present invention. Referring to FIGS. 1A and 1B, a silicon substrate 1 has a pair of major surfaces 101 and 102, and a four-layer laminate structure made up of an n-type emitter region 13, a p-type base region 12, an n-type base region 11 and a p-type emitter region 15 is formed between the major surfaces 101 and 102. The n-emitter region 13 is divided into a plurality of strip regions. Each of the n-emitter regions thus formed is exposed to the major surface 101, and a cathode electrode 31 is provided on the exposed surface of each n-emitter region. The p-base region 12 is exposed to the major surface 101 so as to surround the n-emitter regions 13, and a gate electrode 32 is provided on the exposed surface of the p-base region 12. As shown in FIG. 1A, the cathode electrode 31 includes a common connecting region 310 for connecting in common divided electrode portions kept in ohmic contact with the respective n-emitter regions. The common connecting region 310 is provided above the exposed surface of the p-base region 12, with an $SiO_2$ film (not shown) interposed between the common connecting region 310 and the exposed surface of the p-base region 12 to insulate the common connecting region 310 from the base region 12. The p-emitter region 15 is provided in part of the other major surface 102 in approximate registry with the n-emitter regions. That is, the p-emitter region 15 is divided into a plurality of regions similar to and to oppose to the divided n-emitter regions 13. Further, a first $n^+$-type anode short region 161 penetrates each of the p-emitter regions thus formed, at a central part thereof. A second $n^+$-type anode short region 162 is exposed to part of the major surface 102 other than respective exposed surfaces of the p-emitter regions and respective exposed surfaces of the first $n^+$-type anode short regions 161. An anode electrode 33 is formed all over the major surface 102. The first anode short regions 161 and the second anode short region 162 form a short circuit between the n-base region 11 and the anode electrode 33. Such a shorting structure is effective in improving the turn-off characteristic.

An annular groove or moat 51 is cut in the major surface 101 along the periphery thereof. The moat 51 is cut to such a depth that the bottom of the moat reaches the high resistivity n-base region 11. Accordingly, a pn junction formed between the p-base region 12 and the high resistivity n-base region 11 terminates at the inclined surface of the moat 51. An $n^+$-type channel cut region or channel stopper region 14 which is larger in thickness than the p-base region 12, is formed outside the moat 51 in the form of a ring. A glass material 21 having characteristics which will be explained later, is fired in the moat 51. Part of the major surface 101 other than the part provided with the electrodes is coated with an $SiO_2$ film 41 for the purpose of passivation. The field mitigating means in the present embodiment are made up of the glass material 21 and the $n^+$-type channel stopper region 14 which is larger in thickness than the p-base region 12 and is highly doped.

The above-mentioned GTO can be fabricated, for example, through impurity diffusion techniques, photolithography and selective etching techniques, using an n-type (111) silicon plate having a resistivity of about 60 Ωcm as the starting material. More particularly, gallium is diffused into the high resistivity n-type silicon plate from a pair of major surfaces thereof to form the P-base region 12 and p-emitter region 15. Next, phosphorus is selectively diffused from the major surfaces, more specifically, is diffused into those areas corresponding to regions 14, 161 and 162. At this time, the phosphorus concentration in diffused regions is made larger than the gallium concentration in these regions, and diffusion depth of phosphorus is made greater than that of gallium. Thus, the channel stopper region 14 is formed on the side of the major surface 101, and the first anode short regions 161 and second anode short region 162 are formed on the side of the major surface 102. Then, phosphorus is diffused into those areas corresponding to the n-emitter regions 13 in such a manner that the diffusion depth of phosphorus is smaller than the depth of the p-base region 12, to form the n-emitter regions 13.

The moat 51 can be made through selective etching techniques, and the electrodes 31, 32 and 33 can be formed by depositing such a metal as chromium, nickel, silver and aluminum on predetermined areas of the silicon substrate through vacuum evaporation techniques or the like. The $SiO_2$ film 41 can be formed by thermally oxidizing the exposed surface of the silicon substrate.

Each n-emitter region 13 has a thickness of about 15 $\mu$m, and the surface of diffusion has an impurity concentration of about $10^{20}$ atoms/cm$^3$ or more. The p-base region 12 has a thickness of about 30 $\mu$m, and the surface of diffusion has an impurity concentration of about $10^{18}$ atoms/cm$^3$. The n$^+$-channel stopper region 14 has a thickness of about 70 $\mu$m and a width of about 50 $\mu$m or more, and the surface of diffusion has an impurity concentration of about $10^{20}$ atoms/cm$^3$ or more. The n-base region 11 has a thickness of about 180 $\mu$m and a resistivity of about 60 $\Omega$cm. The moat 51 has a width of about 300 $\mu$m and a depth of about 90 $\mu$m, and therefore the depth of the moat is greater than the thickness of the channel stopper region 14 and also than that of the p-base region 12.

The glass 21 is filled in the moat 51 provided in the above-mentioned GTO. The glass 21 can be formed in such a manner that glass powder is suspended in predetermined liquid, rendered to adhere to the surface of the moat 51 by electrophoresis, and then fired. The glass 21 obtained after firing has a thickness of 20 to 30 $\mu$m. Zinc borosilicate glass was used as the glass material 21. Incidentally, the zinc borosilicate glass is characterized by containing more than about 50 percent ZnO by weight.

The amount of surface charge kept by the glass 21 can be varied by changing the composition of the glass 21, the firing temperature, firing time, firing atmosphere and the cooling rate after firing for the glass 21. Changes in the forward blocking voltage of the above-mentioned GTO (namely, changes in the blocking voltage of the pn junction formed between the p-base region 12 and the n-base region 11) were measured in the case where the amount of charge kept by the glass 21 was varied. The results of measurements are shown in FIG. 2. The amount of charge per unit area at that surface of the glass 21 which is kept in contact with the inner wall of the moat 51, is expressed by $N_{FB}$ (cm$^{-2}$).

As is shown in FIG. 2, the blocking voltage is highest when the surface charge density $N_{FB}$ is within a range from $-3 \times 10^{11}$/cm$^2$ to $-9 \times 10^{11}$/cm$^2$, that is, when the negative surface charge per unit area lies within a range from $3 \times 10^{11}$/cm$^2$. Even when the surface charge density $N_{FB}$ varies to some extent within this range, the high blocking voltage is not affected. In other words, a reproducible, high blocking voltage is obtained, even if the surface charge density $N_{FB}$ fluctuates. Accordingly, in the present embodiment, it is preferred that the glass 21 has a surface charge density $N_{FB}$ of $-3 \times 10^{11}$/cm$^2$ to $-9 \times 10^{11}$/cm$^2$.

According to experiments made by the present inventors, when zinc borosilicate glass was fired at a temperature of 680° to 740° C. for about 40 minutes in an atmosphere containing 1 to 100 weight percent dry $O_2$ (and the balance $N_2$), and then cooled at a rate of about 1° C./min., a value of $N_{FB}$ within the above-mentioned range was obtained. The above-mentioned zinc borosilicate glass essentially consisted, for example, of 65 percent ZnO, 21 percent $B_2O_3$, 8.5 percent $SiO_2$, 4 percent PbO, 1 percent SnO and 0.5 percent $Sb_2O_3$ by weight.

In the present embodiment, the thickness of the n$^+$-type channel stopper region 14 is made larger than that of the p-base region 12. Such a structure has the following advantages. Firstly, it is not required that a p-type impurity is selectively diffused into the silicon substrate 1 from the major surface 101 to form the p-base region 12. That is, when the p-type impurity is diffused to a predetermined depth from the whole of the major surface 101 and then an n-type impurity is selectively diffused into the channel stopper region 14 in such a manner that the concentration of the n-type impurity is higher than that of the p-type impurity and the diffusion depth of the n-type impurity is greater than that of the p-type impurity, the channel stopper region shown in FIG. 1B is formed. Accordingly, the fabricating process can be simplified. Such a fabricating method is specifically advantageous in the case where gallium and aluminum are diffused as the p-type impurity, since it is difficult to obtain an appropriate mask for selective diffusion of gallium and aluminum. Further, let us suppose the case where the region 14 is smaller in thickness than the region 12. In this case, it is required to selectively form the region 12 in that part of the major surface 101 which is surrounded by the moat 51. If, in the above selective formation process, pin holes are accidentally generated in a cover for masking a portion of the major surface 101 outside the moat 51 from a diffusion source, p-type regions which are greater in depth than the region 14, are formed in the surface portion outside the moat 51, and the function of the channel stopper region is deteriorated. In other words, the effective width of the channel stopper region is made small. Further, the fabricating yield of the high breakdown voltage semiconductor device is lowered. According to the present embodiment, all of these drawbacks can be eliminated.

Secondly, the gradient of impurity concentration at the boundary between the n$^+$-type channel stopper region 14 and the n-base region 11 becomes gentle, since the thickness of the region 14 is large. Accordingly, when a pn junction exposed at the moat 51 is reversely biased, the depletion layer extends from the pn junction into the n-base region 11 and, even after it has reached the channel stopper region 14, it can be further extended gradually in the channel stopper region 14 when the reverse bias voltage is increased. Thus, even when a high reverse bias voltage is applied, the concentration of electric field is mitigated, and therefore it is possible to provide a high breakdown voltage.

The width of the channel stopper region 14 (that is, the width of the region 14 at the boundary between the region 14 and the n-base region 11 in the direction perpendicular to the lengthwise direction of the moat 51) is preferably made larger than 50 μm, in order to extend the depletion layer effectively and to make high the breakdown voltage.

The depth of the moat 51 is preferably made larger than respective thicknesses of the p-base region 12 and channel stopper region 14. In the case where the depth of the moat 51 is smaller than the thickness of the p-base region 12 so that part of the p-base region 12 is extended along the bottom of the moat 51 and the pn junction J terminates at the bottom of the moat 51, the breakdown voltage varies widely. This is because an electric field generated at a terminated portion of the pn junction J when the pn junction J is applied with a reverse bias voltage, depends upon the length of that portion of the p-base region which is located beneath the bottom of the moat 51 and upon the depth of the moat 51 in a critical manner, and cannot be easily controlled.

Further, a difference in depth between the bottom of the moat 51 and the bottom of the region 12 (namely, the pn junction J) is preferably made larger than 10 μm to make variations in the breakdown voltage small. The reason for this is as follows. The compensation of impurity concentration takes place in the proximity of a pn junction, since two regions of different conductivity types are contiguous to each other at the pn junction to render the compensated regions to be of higher resistivity. Thus, the depletion layer can be readily extended in such regions. When the pn junction is located in the proximity of the bottom of the moat 51, the depletion layer can be easily extended to reach the bottom of the moat 51 and further extension of the depletion layer is restricted. Therefore, the blocking voltage can be lowered at a portion beneath the moat 51, and the leakage current can be increased.

When the channel stopper region is formed through diffusion, it is desired to make the time required for the formation of the channel stopper region as short as possible. Accordingly, it is preferred to make the thickness of the channel stopper region smaller than the depth of the moat 51.

Now, a second embodiment of the present invention will be explained with reference to FIGS. 3A and 3B. The second embodiment relates to a reverse blocking thyristor. Unlike the above-mentioned GTO having a shorting structure in the anode region, the reverse blocking thyristor is required to be able to block both of forward and reverse voltages applied between anode and cathode electrodes. That is, a high blocking voltage is desired in both the forward and reverse directions.

Figure 3A:
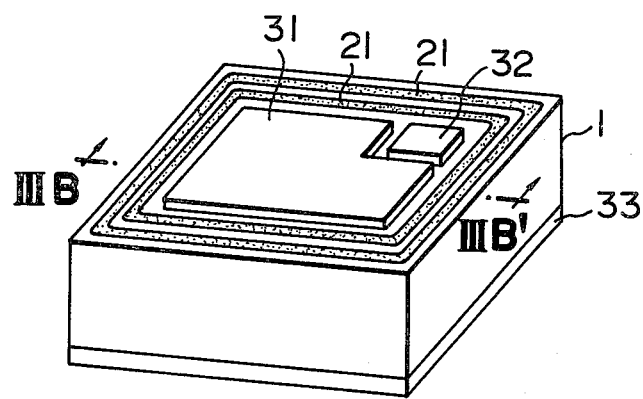
FIG. 3A is a perspective view showing the whole of a reverse blocking thyristor chip of corner gate type according to another embodiment of the present invention.
Figure 3B:
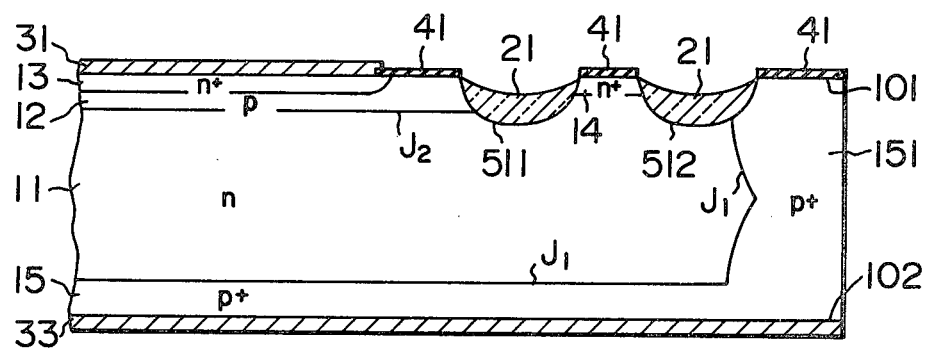
FIG. 3B is an enlarged, sectional view showing part of the cross section taken along the line IIIB—IIIB' in FIG. 3A.

In FIGS. 3A and 3B, similar parts or equivalents to those in FIGS. 1A and 1B are given the same reference symbols as in FIGS. 1A and 1B. Referring to FIGS. 3A and 3B, two moats 511 and 512 are provided in one major surface 101, and the depth and width of each of the moats 511 and 512 are nearly equal to the depth and width of the moat 51 shown in FIG. 1B. The distance between the moats 511 and 512 is about 70 μm. Cathode and gate electrodes 31 and 32 are formed on that inner part of the major surface 101 which is surrounded by the inner moat 511. The gate electrode 32 is disposed on a portion near one corner of the above-mentioned inner part having a substantially rectangular form. The cathode electrode 31 is insulated from the gate electrode 32, and is formed on the remaining portion in the above inner part. Such an electrode arrangement is called the corner gate type.

FIG. 3B shows a main part of a cross section taken along the line IIIB—IIIB' in FIG. 3A. Referring to FIG. 3B, an n-emitter region 13, a p-base region 12, an n-base region 11 and a p-emitter region 15 are stacked in the order described, between the cathode electrode 31 and the anode electrode 32 formed on the other major surface 102. Unlike the embodiment shown in FIGS. 1A and 1B, the n-emitter region 13 is not divided into plural regions, and the p-emitter region 15 has no shorting structure and is uniform in structure. A pn junction $J_1$ between the n-base region 11 and the p-emitter region 15 terminates at the outer moat 512 due to the presence of a $p^+$-type region 151 (communicating with the p-emitter region 15) for connecting the major surfaces 101 and 102 at their peripheral portions. A pn junction $J_2$ between the p-base region 12 and the n-base region 11 terminates at the inner inclined surface of the inner moat 511, and the pn junction $J_2$ and the inner inclined surface of the moat 511 form a negative bevel structure. Between the moats 511 and 512 is formed an $n^+$-type channel stopper region 14 which is exposed to the major surface 101, and has substantially the same depth as the n-emitter region 13 and is ring-shaped. A glass material 21 having negative charge is filled in each of the moats 511 and 512. An $SiO_2$ film 41 for passivation is formed on the major surface 101 in the area other than the gate and cathode electrode areas. In the second embodiment, the field mitigating means include the moats 511 and 512 filled with negatively charged glass material 21 and the channel stopper region 14.

The semiconductor element shown in FIGS. 3A and 3B can be fabricated through impurity diffusion techniques, photo-lithography, selective etching techniques and others, in the same manner as the embodiment shown in FIGS. 1A and 1B. Further, the same materials as used in the embodiment shown in FIGS. 1A and 1B can be used. Additionally speaking, the channel stopper region 14 and n-emitter region 13 shown in FIG. 3B can be simultaneously formed by the diffusion method. In this case, the region 14 has an equal thickness to the region 13. Needless to say, it is possible to make the thickness of the region 14 greater than that of the n-emitter region 13 as in the embodiment shown in FIGS. 1A and 1B. Such a structure is preferred, since the blocking voltage is enhanced. The $p^+$-type region 151 can be formed in such a manner that a p-type impurity is diffused from respective peripheral portions of the major surfaces 101 and 102 into the semiconductor substrate to a depth corresponding to more than one half of the thickness of the semiconductor substrate so that two diffused regions meet each other.

In a forward blocking state of the second embodiment, namely, when an input voltage is applied between the anode and cathode electrodes 33 and 31 in such a manner that the potential of the anode electrode 33 is positive as compared with that of the cathode electrode 31, a depletion layer is extended from the pn junction $J_2$ mainly into the n-base region 11. Since the glass material 21 has negative charge, the depletion layer is more easily extended along the moat 511 rather than into the bulk of the semiconductor substrate in the area away from the moat. Accordingly, the electric field in the region around the moat is mitigated. When the voltage applied between the anode and cathode electrodes is made higher, the end of the depletion layer will reach the channel stopper region 14. Since the region 14 is higher in impurity concentration than the n-base region 11, the rate of extension of the depletion layer will be largely slowed down in the channel stopper region 14. Thus, the depletion layer is prevented from being further extended outward and from being exposed to the periphery of the semiconductor substrate. Accordingly, it is possible to maintain a high blocking voltage. The rate of extension of the depletion layer in the portion of the region 11 along the moat is determined mainly by the amount of charge kept by the glass material 21. Experiments made by the present inventors have shown that a surface charge density $N_{FB}$ of the glass material 21 is preferably in a range from $-3 \times 10^{11}$ cm$^{-2}$ to $-9 \times 10^{11}$ cm$^{-2}$ to provide a breakdown voltage of about 1.6 kV, which has not been obtained heretofore.

When the polarity of the voltage applied between the anode and cathode electrodes is reversed with the potential of the cathode electrode being changed positive as compared with that of the anode electrode, the thyristor takes a reverse blocking state. At this time, a depletion layer is extended from the pn junction $J_1$ mainly into the n-base region 11. In the portion along the moat 512, the rate of extension of the depletion layer becomes slow in the channel stopper region 14 in accordance with the same mechanism as in the forward blocking state. Accordingly, even when a higher reverse voltage is applied, the depletion layer is not extended along the moat 511 and does not reach the p-base region 12, and the blocking state is not destroyed.

It is to be noted in the second embodiment that the pn junction $J_1$ and the outer inclined surface of the moat 512 form a positive bevel structure, whereas the pn junction $J_2$ and the inner inclined surface of the moat 511 form a negative bevel structure.

In such a situation, if the channel stopper region is absent and the glass 21 has negative charge, the blocking ability in the forward blocking state is good but the blocking ability in the reverse blocking state is not so good. On the other hand, if the channel stopper region is present and the glass 21 has positive charge, the blocking ability in the reverse blocking state is good but the blocking ability in the forward blocking state is not so good. In the second embodiment, the blocking function is good in both of the forward and reverse blocking states, since the channel stopper region is formed and the glass 21 has negative charge.

Figure 4A:
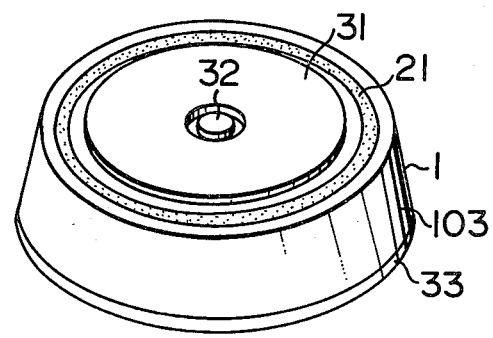
FIG. 4A is a perspective view showing the whole of a reverse blocking thyristor chip of center gate type according to a third embodiment of the present invention.

Next, a third embodiment of the present invention will be explained with reference to FIGS. 4A and 4B. In the third embodiment, a semiconductor substrate 1 has a disc shape. Each of a pair of major surfaces 101 and 102 has a circle shape, and the diameter of the major surface 101 is smaller than that of the major surface 102. A side surface 103 connecting the major surfaces 101 and 102 does not make a right angle with the major surfaces 101 and 102, but is inclined at an angle to the major surfaces 101 and 102. Referring to FIG. 4A, a gate electrode 32 is formed on a central portion of the major surface 101, and a cathode electrode 31 is formed on the major surface 101 to be insulated from and to surround the gate electrode 32. An annular or ring-shaped moat 51 is formed around the cathode electrode 31. An anode electrode 33 is formed on the whole of the other major surface 102. The above-mentioned third embodiment is a reverse blocking thyristor having the same function as the reverse blocking thyristor shown in FIGS. 3A and 3B. The thyristor of this embodiment as shown in FIG. 4A is called the reverse blocking thyristor of center gate type, since the gate electrode is arranged at a central portion of one major surface.

Figure 4B:
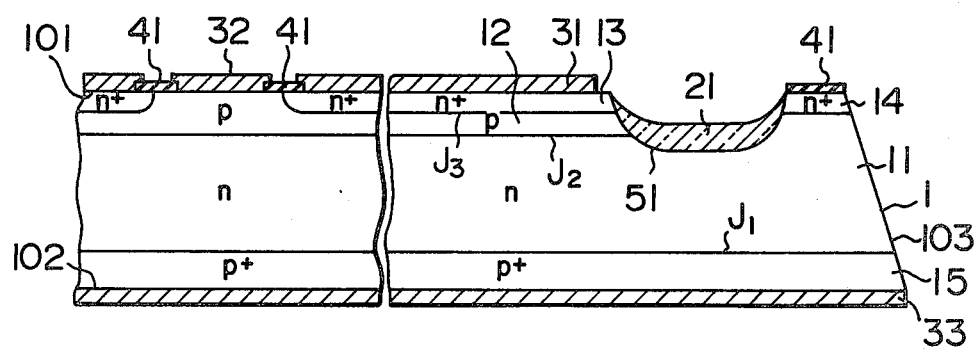
FIG. 4B is an enlarged, sectional view showing part of the cross section taken along a line intersecting the center of one major surface in FIG. 4A.

FIG. 4B shows a main part of a cross section taken along a diameter of the circular plate in FIG. 4A. Referring to FIG. 4B, an n-emitter region 13, a p-base region 12, an n-base region 11 and a p-emitter region 15 are stacked between the cathode electrode 31 and the anode electrode 33, as in FIG. 3B. However, unlike the second embodiment shown in FIG. 3B, the p-emitter region 15 is uniform and terminates at the side surface 103 of the semiconductor substrate 1. The p-emitter region 15 is higher in impurity concentration than the n-base region 11. The side surface 103 is tapered toward the major surface 101 in such a manner that the area of a plane parallel to the major surfaces 101 and 102 is diminished in a direction from the major surface 102 to 101. Therefore, a pn junction $J_1$ which is formed between the p-emitter region 15 and the n-base region 11, and the side surface 103 form a positive bevel structure. Such a positive bevel structure is effective in making high the blocking voltage of the pn junction $J_1$, as described in U.S. Pat. No. 3,491,272. A pn junction $J_2$ between the p-base region 12 and the n-base region 11 terminates at the inner inclined surface of the moat 51. The p-base region 12 is higher in impurity concentration than the n-base region 11. Therefore, the inner inclined surface of the moat 51 and the pn junction $J_2$ form a negative bevel structure. The depth of the moat 51 is made greater than the depth of the pn junction $J_2$. A pn junction $J_3$ which is formed between the n-emitter region 13 and the p-base region 12, and the pn junction $J_2$ terminate at the inner inclined surface of the moat 51. An n$^+$-type channel stopper region 14 is formed between the outer inclined surface of the moat 51 and the side surface 103 to connect these surfaces with each other. The channel stopper region 14 has substantially the same thickness as the n-emitter region 13 and has a width of about 60 $\mu$m. Glass material 21 which has an appropriate composition is applied in the moat 51 and fired to have negative charge.

In the above-mentioned semiconductor element of the third embodiment, field mitigating means include the moat 51, the glass 21 in the moat and the positive bevel structure formed by the pn junction $J_1$ and the side surface 103.

The semiconductor element shown in FIGS. 4A and 4B can be fabricated in similar manner as the second embodiment shown in FIGS. 3A and 3B, and therefore a detailed explanation is omitted. Further, the same materials as used in the second embodiment can be used in the third embodiment. When the thyristor of this embodiment shown in FIGS. 4A and 4B takes a forward blocking state, a high blocking voltage is obtained on the basis of the same mechanism as in the embodiments shown in FIGS. 1A and 3A. On the other hand, when the thyristor takes a reverse blocking state (i.e., when the greater part of a voltage applied across the thyristor is applied across the pn junction $J_1$), a high breakdown voltage is obtained on the basis of the positive bevel structure at the side surface 103.

Next, explanation will be made on glass which can be used as the glass material 21 in the above-mentioned embodiments. The above glass essentially consists of three main components ZnO, $B_2O_3$ and $SiO_2$. Similar glass material is disclosed in German Patent Laid-Open Specification No. 2851479.

Figure 5:
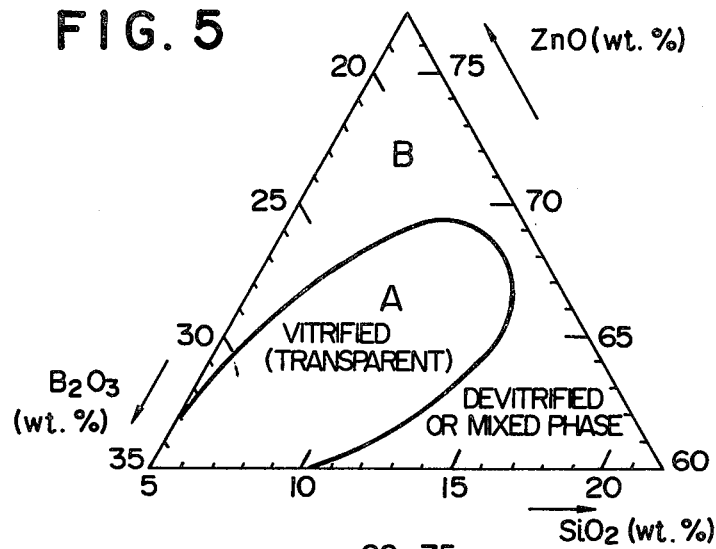
FIG. 5 is a three-component composition diagram for showing a vitrifiable range of $ZnO-B_2O_3-SiO_2$ glass applicable to the present invention.

At first, various materials containing three components ZnO, $B_2O_3$ and $SiO_2$ at different mixing ratios were prepared to find a vitrifiable composition range. The results obtained are shown in FIG. 5. In FIG. 5, a region A indicates a composition range in which transparent glass was formed, and a region B indicates a composition range in which any mixed material was devitrified or divided into a plurality of phases and therefore transparent glass was not obtained.

Figure 6A:
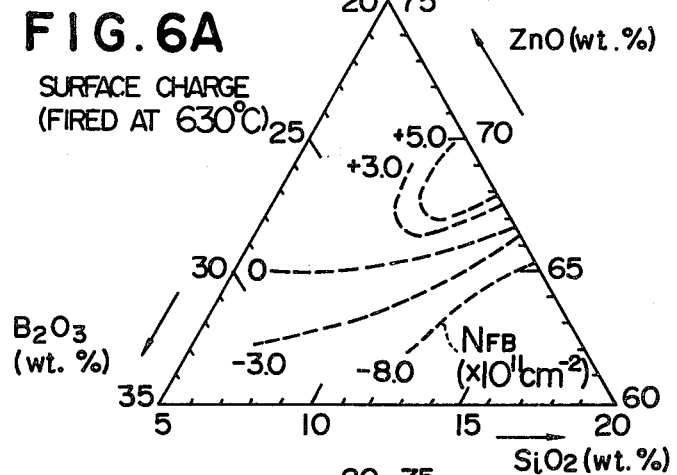
Figure 6B:
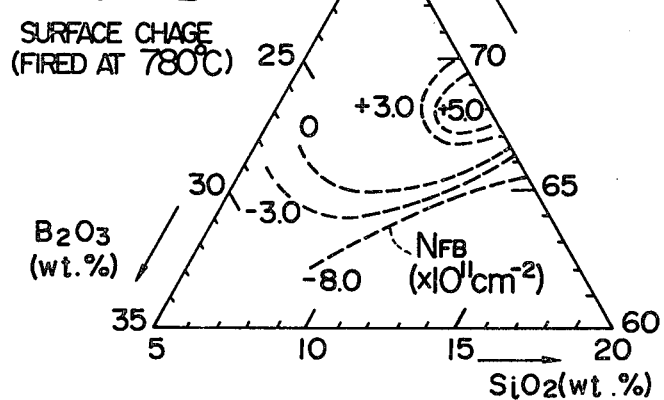

Next, a glass material having a composition in the vitrifiable range shown in FIG. 5A was fused in a platinum crucible, and then quenched in the pure water to obtain a lump of glass, which was finely pulverized by a ball mill to obtain a glass powder for passivation. Various glass powders having different compositions within the vitrifiable range were prepared. Each of these glass powder materials was fired on a silicon substrate at a temperature in a range from 630° C. to 780° C., and the surface charge density $N_{FB}$ was measured. In such a temperature range, glass is readily softened and is not crystalized. FIG. 6A shows equi-$N_{FB}$ curves which were obtained when the glass powder materials were fired at 630° C., FIG. 6B shows equi-$N_{FB}$ curves for a firing temperature of 780° C. As is apparent from FIGS. 6A and 6B, the value of $N_{FB}$ varies greatly with the composition, namely, the mixing ratio of the three components, and moves to the negative side as the firing temperature is higher.

A composition range of glass and a range of firing temperature which are preferably applied to the present invention, are known from FIGS. 6A and 6B.

In the case where glass is applied on a semiconductor material, it is desired that the coefficient of thermal expansion of the glass is as close to that of the semiconductor material as possible. In the case where a large number of elements or chips are simultaneously formed in a semiconductor wafer having a large diameter and then are divided into the respective elements, moats as described in the above-mentioned embodiments are distributed almost all over one major surface of the wafer with glass filled therein. In such a case, if the above glass has a greatly different thermal expansion coefficient from that of the semiconductor wafer, the semiconductor wafer is warped due to the different thermal expansion (contraction) during cooling from the firing temperature to the room temperature. When a photo-etching process is to be carried out for the wafer (for example, when the gate and cathode electrodes are to be formed through the photo-etching process in the above-mentioned embodiments), such a warp may constitute an obstacle to print a predetermined photoresist pattern precisely on the wafer. Further, when the wafer is warped largely, there is a fear of the wafer and glass being cleaved and/or cracked. In the case of silicon, to avoid such difficulties, it is preferable to set the coefficient of thermal expansion of glass after firing within a range from $25 \times 10^{-7}/°$ C. to $50 \times 10^{-7}/°$ C.

Figure 7A:
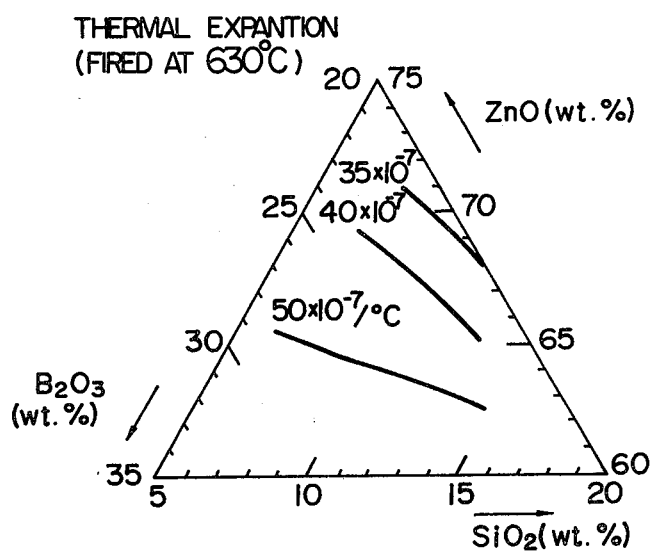
Figure 7B:
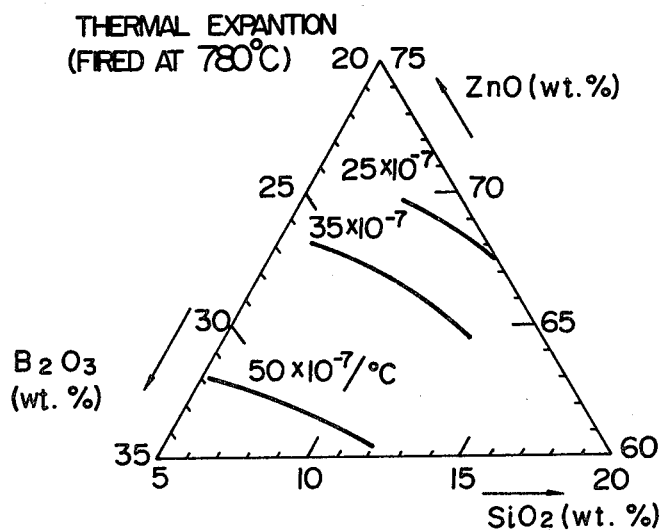

The glass containing three main components ZnO, $B_2O_3$ and $SiO_2$ as described above has such thermal expansion characteristics as mentioned below. Each of glass powder materials having various compositions within the vitrifiable range shown in FIG. 5 was fired to a thickness of 10 μm on a silicon wafer of 200 to 500 μm thick at a temperature within a range from 630° to 780° C., and the relation between the warp of silicon wafer and the difference in coefficient of thermal expansion between glass and silicon was studied. As a result of the study, it was found that the coefficient of thermal expansion of glass varied greatly with the composition of glass and the firing temperature. FIG. 7A shows equi-thermal-expansion curves in the case where glass powder materials were fired at 630° C., and FIG. 7B shows equi-thermal-expansion curves for a firing temperature of 780° C. As is apparent from the comparison between FIGS. 7A and 7B, glass containing a large amount of ZnO is smaller in the coefficient of thermal expansion, and the equi-thermal-expansion curves move to a composition region containing a relatively smaller amount of ZnO, as the firing temperature is higher. When glass had a coefficient of thermal expansion of $25 \times 10^{-7}/°$ C. to $50 \times 10^{-7}/°$ C. after firing, the warp of silicon wafer was small and it was possible to precisely print a photoresist pattern for photo etching. Moreover, glass was not cracked. On the other hand, when glass had a coefficient of thermal expansion less than $25 \times 10^{-7}/°$ C. or more than $50 \times 10^{-7}/°$ C. after firing, glass might be broken, or the warp of silicon water became large and therefore it was difficult to print the photoresist pattern.

A composition range of glass and a range of firing temperature, which are preferable in the present invention, are known from FIGS. 7A and 7B. Since the above-mentioned glass contains only three main components ZnO, $B_2O_3$ and $SiO_2$, variations in characteristic of glass are limited in a relatively small range. Accordingly, when the above glass is used, uniform, reproducible semiconductor elements are obtained.

While the preferred embodiments have been explained, the present invention is not limited to these embodiments but is applicable to various semiconductor devices. For example, when the p-emitter region 15 in the embodiment shown in FIGS. 1A and 1B is replaced by an n-type semiconductor region, a transistor structure is obtained. Such a structure is also encompassed within the scope of the present invention. Further, in the embodiment shown in FIG. 4B, the side surface 103 of the semiconductor substrate 1 may be coated with a passivation material such as glass or resin. The materials, fabricating methods and dimensions used in the embodiments may be appropriately altered. Further, the conductivity type of each semiconductor region may be reversed. In this case, glass having positive charges is employed, and a preferable range of surface charge density is $+3 \times 10^{11}$ cm$^{-2}$ to $+9 \times 10^{11}$ cm$^{-2}$.

We claim:

1. A semiconductor device formed in a semiconductor substrate having a pair of major surfaces, comprising:

a closed-loop-shaped moat formed in at least one of the major surfaces and having an inner inclined side surface, a bottom surface and an outer side surface;

a first and a second semiconductor region formed in said semiconductor substrate, having an opposite conductivity type to each other and forming a pn junction therebetween, the pn junction terminating at said inner inclined surface of the moat, the first semiconductor region having a first conductivity type and extending along the bottom surface of the moat and beyond the moat;

a channel stopper region of closed-loop shape formed in said semiconductor substrate along said outer side surface of the moat adjacent to said first semiconductor region and having said first conductivity type, a higher impurity concentration than that of the first semiconductor region and a larger depth from said one major surface than said pn junction;

a pair of electrode means formed on said pair of major surfaces, capable of applying a reverse bias across said pn junction; and a fired glass member applied in said moat for passivating the terminated end of the pn junction, and having charge of that polarity which induces carriers of opposite polarity to said first conductivity type in the adjacent first region, the charge of said glass member enhancing the extension of a depletion layer extending from the reversely biased pn junction into said first semiconductor region;

the channel stopper region retarding the extension of the depletion layer which has reached the channel stopper region.

2. A semiconductor device of gate turn off type comprising:

a semiconductor substrate having a pair of major surfaces and including therein a four-layer structure, said four-layer structure being formed in such a manner that a first emitter region of one conductivity type, a first base region of the other conductivity type, a second base region of said one conductivity type and a second emitter region of said other conductivity type are stacked in the order described in a direction from one major surface to the other major surface, each pair of adjacent regions of opposite conductivity types in said four-layer structure forming a pn junction therebetween, said first base region being lower in resistivity than said second base region, a closed-loop-shaped moat being formed in said one major surface, a depth of a bottom of said moat being larger than a depth of a pn junction formed between said first base region and said second base region, a termination of said pn junction being exposed to an inner inclined surface of said moat, at least a laminate structure being formed in said semiconductor substrate at the outside of said moat, said laminate structure including a closed-loop-shaped channel stopper region of said one conductivity type and said second base region in this order in a direction from said one major surface to said other major surface, said channel stopper region being formed in such a manner as being contiguous to an outer inclined surface of said moat, said channel stopper region being made larger in depth than said first base region, said channel stopper region being higher in impurity concentration than said second base region;

fired glass formed in said moat for passivating an exposed termination of said pn junction formed between said first base region and said second base region, said fired glass being prepared so as to have electric charge of a polarity for inducing carriers in part of said second base region in contact with said moat, said carriers having a polarity opposite to said one conductivity type;

a first main electrode formed on said one major surface and kept in ohmic contact with said first emitter region;

a gate electrode formed on said one major surface and kept in ohmic contact with said first base region; and a second main electrode formed on said other major surface and kept in ohmic contact with said second emitter region.

3. A semiconductor device as claimed in claim 2, wherein said semiconductor substrate further includes therein an emitter shorting semiconductor region of said one conductivity type which is exposed to said other major surface and is formed in such a manner that said emitter shorting semiconductor region is placed side by side with and is contiguous to said second emitter region, and wherein said emitter shorting region has substantially the same thickness and surface impurity concentration as said channel stopper region and makes an ohmic connection between said second base region and said second main electrode.

4. A semiconductor device as claimed in claim 2 or 3, wherein said second base region is an n-type region, and said fired glass has negative surface charge.

5. A semiconductor device of thyristor type comprising:

a semiconductor substrate having a pair of major surfaces, at least two moats being concentrically formed in one of said major surfaces, each of said moats having the form of a closed-loop, part of said semiconductor substrate inside an intermost one of said moats including therein a first emitter layer of one conductivity type, a first base layer of the other conductivity type, a second base layer of said one conductivity type and a second emitter layer of said other conductivity type, said first emitter layer, said first base layer, said second base layer and said second emitter layer being formed in this order in a direction from said one major surface to the other major surface so that each of boundaries therebetween forms a pn junction, an end portion of a pn junction between said first base layer and said second base layer being exposed to an inner inclined side surface of said innermost moat, a pn junction between said second base layer and said second emitter layer being bent at a peripheral portion of said semiconductor substrate so as to be directed to said one major surface, an end portion of said pn junction between said second base layer and said second emitter layer being exposed to a surface of a outermost one of said moats in such a manner that an angle between said end portion and said surface is more than 90° when viewed from the side of said second emitter layer, a channel stopper region being formed in a part of said semiconductor substrate between said innermost moat and said outermost moat so as to be exposed to said one major surface and to be kept in direct contact with said second base layer at a level below said pn junction between said first and second base layers, said channel stopper region having a form of a closed-loop and the same conductivity type as said second base layer, said channel stopper region being higher in impurity concentration than said second base layer;

fired glass formed in at least said innermost and outermost moats for passivating respective exposed end portions of said pn junctions, a composition and firing conditions of said fired glass having been adjusted so that said fired glass has electric charge of a polarity for inducing carriers in part of said second base layer in contact with said innermost and outer most moats, said carriers having a polarity opposite to said conductivity type of said second base layer;

a first main electrode formed on said one major surface and kept in ohmic contact with said first emitter layer;

a second main electrode formed on said other major surface and kept in ohmic contact with said second emitter layer; and a gate electrode formed on said one major surface and kept in ohmic contact with said first base layer.

6. A semiconductor device as claimed in claim 5, wherein two moats are formed in said one major surface.

7. a semiconductor device of thyristor type comprising:

a semiconductor substrate having a pair of major surfaces and an inclined side surface, said major surfaces having substantially similar forms, one of said major surfaces being opposed to the other major surface, said one major surface being smaller in area than said other major surface, said side surface connecting the periphery of said one major surface and the periphery of said other major surface, a moat being formed in said one major surface, said moat having a form of a closed-loop, part of said semiconductor substrate inside said moat including therein a first emitter layer of one conductivity type, a first base layer of the other conductivity type, a second base layer of said one conductivity type and a second emitter layer of said other conductivity type, said first emitter layer, said first base layer, said second base layer and said second emitter layer being formed in this order in a direction from said one major surface to said other major surface so that each of boundaries therebetween forms a pn junction, said first base layer being higher in impurity concentration than said second base layer, said second emitter layer being higher in impurity concentration than said second base layer, an end portion of a pn junction between said first base layer and said second base layer being exposed to an inner inclined side surface of said moat in such a manner that an angle between said end portion and said inner inclined side surface is less than 90° when viewed from the side of said first base layer, an end portion of a pn junction between said second base layer and said second emitter layer being exposed to said side surface of said semiconductor substrate in such a manner that an angle between said end portion and said side surface is more than 90° when viewed from the side of said second emitter layer, a channel stopper region being formed in said semiconductor substrate at the outside of said moat in such a manner that said channel stopper region is in contact with an outer periphery of said moat, is contiguous to said second base layer at a level below the pn junction between the first and the second base layers, and is exposed to said one major surface, said channel stopper region having a form of a closed-loop and the same conductivity type as said second base region, said channel stopper region being higher in impurity concentration than said second base layer;

fired glass formed in said moat for passivating said exposed end portion of said pn junction between said first and second base layers, a composition and firing conditions of said fired glass having been adjusted so that said first glass has electric charges of a polarity for inducing carriers in part of said second base layer in contact with said moat, said carriers having a polarity opposite to said conductivity type of said second base layer;

a first main electrode formed on said one major surface and kept in ohmic contact with said first emitter layer;

a second main electrode formed on said other major surface and kept in ohmic contact with said second emitter layer; and a gate electrode formed on said one major surface and kept in ohmic contact with said first base layer.

8. A semiconductor device as claimed in claim 7, wherein each of said major surfaces has substantially a form of a circle, and said moat has substantially a form of circular ring.

9. A semiconductor device as claimed in claim 1 or 2, wherein the absolute value of surface charge density of said electric charge kept by said fired glass lies within a range from $3 \times 10^{11}$ cm$^{-2}$ to $9 \times 10^{11}$ cm$^{-2}$.

10. A semiconductor device as claimed in claim 1, 2, 5 or 7, wherein said channel stopper region has a width of 50 $\mu$m or more.

11. A semiconductor device as claimed in claim 1, 2, 5 or 7, wherein said fired glass contains three main components ZnO, $B_2O_3$ and $SiO_2$.

12. A semiconductor device as claimed in claim 2, wherein said first emitter region includes a plurality of divided areas, each being surrounded by said first base region.

13. A semiconductor device as claimed in claim 12, wherein said first main electrode includes a plurality of finger portions ohmically contacting the respective divided areas of said first emitter region, and a common connecting portion being integrated with said finger portions for commonly connecting said finger portions electrically, and wherein said gate electrode includes a plurality of finger portions interlocking with said finger portions of said first main electrode and a common connecting portion integrated with and commonly electrically connecting the finger portions of the gate electrode.

14. A semiconductor device as claimed in claim 12, wherein said second emitter region includes a plurality of divided areas which are approximately registered with and oppose to the divided areas of said first emitter region and which are surrounded by said second base region, and wherein said second main electrode makes ohmic contact with said second emitter region and said second base region which surrounds said second emitter region.

15. A semiconductor device as claimed in claim 14, wherein said second base region includes a first short-circuiting portion of said one conductivity type located at and penetrating through a central part of each of said second emitter region and having a higher impurity concentration than a main part of said second base region disposed between the first base region and the second emitter region.

16. A semiconductor device as claimed in claim 15, wherein said second base region further includes a second short-circuiting portion of said one conductivity type located around said second emitter region, exposed to said second major surface and having a higher impurity concentration than the main part of said second base region.

17. A gate-turn-off thyristor device formed in an n type high resistivity silicon substrate having a first and a second major surface, comprising:

a first base region of p type singly and uniformly diffused from the first major surface and forming a substantially flat base pn junction with the n type substrate;

a first emitter region of n type selectively doped in the first base region from the first major surface and forming a first emitter pn junction with the first base region;

a second emitter region of p type singly and uniformly diffused from the second major surface and forming a second emitter pn junction with the n type substrate, the first base region and the second emitter region having substantially the same thickness;

a second base region formed of the n type substrate;

a channel stopper region highly diffused from the first major surface with n type impurity to have an impurity concentration larger than that of the first base region, disposed around the first base region in a closed loop shape, and having a diffusion depth larger than that of the first base region to form a boundary with said second base region deeper than said base pn junction;

a moat of closed loop shape formed in the first major surface between said first base region and said channel stopper region to extend through said first base and said channel stopper regions into the second base region, the moat having an inclined inner side surface at which said base pn junction terminates to form a negative bevel structure, a bottom surface of said moat contacting the second base region, and an inclined outer side surface at which the boundary of said channel stopper region and said second base region terminates; and fired glass filler applied in the moat, covering the surface of the moat, and having a negative charge which enhances extension of a depletion region in the second base region.

18. A gate-turn-off thyristor device as claimed in claim 17, wherein said negative charge of the fired glass filler has a surface density of $-3 \times 10^{11}/cm^2$ to $-9 \times 10^{11}/cm^2$.

19. A gate-turn-off thyristor device as claimed in claim 18, wherein said fired glass filler has a thickness of 20 to 30 $\mu$m.

20. A gate-turn-off thyristor device as claimed in claim 17, wherein the channel stopper region has a width larger than 50 $\mu$m at the boundary between said channel stopper region and said second base region.

21. A gate-turn-off thyristor device as claimed in claim 17, wherein a difference in depth from the first major surface, between the bottom surface of said moat and said base pn junction is larger than 10 $\mu$m.

22. A gate-turn-off thyristor device as claimed in claim 17, wherein said n type silicon substrate has a resistivity of about 60 $\Omega$cm, said first emitter region has a thickness of about 15 $\mu$m and a surface impurity concentration of at least about $10^{20}$ atoms/cm$^3$, said first base region has a thickness of about 30 $\mu$m and a surface impurity concentration of about $10^{18}$ atoms/cm$^3$, and said channel stopper region has a thickness of about 70 $\mu$m, a width of at least about 50 $\mu$m at said boundary between said channel stopper region and said second base and a surface impurity concentration of at least about $10^{20}$ atoms/cm$^3$.

23. A gate-turn-off thyristor device as claimed in claim 22, wherein said moat has a maximum width of about 300 $\mu$m and a depth of about 90 $\mu$m.

24. A gate-turn-off thyristor device as claimed in claim 23, wherein said fired glass filler contains ZnO, B$_2$O$_3$ and SiO$_2$ and carries a negative surface charge density of $-3 \times 10^{11}/cm^2$ to $-9 \times 10^{11}/cm^2$.

25. A gate-turn-off thyristor device as claimed in claim 17, wherein said first base and said channel stopper regions have depths within a range of 10 to 70 $\mu$m.

26. A gate-turn-off thyristor device as claimed in claim 24, wherein said fired glass filler essentially consists of ZnO, B$_2$O$_3$, SiO$_2$, PbO, SnO and Sb$_2$O$_3$ and carries a negative surface charge density of $-3 \times 10^{11}/cm^2$ to $-9 \times 10^{11}/cm^2$.

* * * * *

UNITED STATES PATENT AND TRADEMARK OFFICE
CERTIFICATE OF CORRECTION

PATENT NO.  :   4,484,214
DATED       :   November 20, 1984
INVENTOR(S) :   Misawa et al It is certified that error appears in the above-identified patent and that said Letters Patent is hereby corrected as shown below:

On the Title Page delete:

"[30]    Foreign Application Priority Data
    Oct. 27, 1980 [JP]   Japan............55-149453"

Signed and Sealed this

Tenth  Day of  September 1985

[SEAL]

Attest:

DONALD J. QUIGG

Attesting Officer    Acting Commissioner of Patents and Trademarks - Designate